United States Patent
Nojima et al.

(10) Patent No.: US 7,788,626 B2
(45) Date of Patent: Aug. 31, 2010

(54) PATTERN DATA CORRECTION METHOD, PATTERN CHECKING METHOD, PATTERN CHECK PROGRAM, PHOTO MASK PRODUCING METHOD, AND SEMICONDUCTOR DEVICE MANUFACTURING METHOD

(75) Inventors: Shigeki Nojima, Yokohama (JP); Satoshi Tanaka, Kawasaki (JP); Toshiya Kotani, Machida (JP); Kyoko Izuha, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 592 days.

(21) Appl. No.: 11/138,407

(22) Filed: May 27, 2005

(65) Prior Publication Data

US 2005/0273754 A1 Dec. 8, 2005

(30) Foreign Application Priority Data

May 28, 2004 (JP) ............................. 2004-160127

(51) Int. Cl.
*G06F 17/50* (2006.01)
(52) U.S. Cl. ......................................... 716/19; 716/21
(58) Field of Classification Search .............. 716/19–21; 430/5, 22, 30
See application file for complete search history.

(56) References Cited

U.S. PATENT DOCUMENTS

| | | | | |
|---|---|---|---|---|
| 6,154,563 A * | 11/2000 | Tsudaka | | 382/144 |
| 6,245,466 B1 | 6/2001 | Kotani et al. | | |
| 6,519,759 B2 * | 2/2003 | Tounai | | 716/19 |
| 6,553,559 B2 | 4/2003 | Liebmann et al. | | |
| 6,576,377 B2 * | 6/2003 | Kikuchi | | 430/5 |
| 6,656,646 B2 * | 12/2003 | Hotta et al. | | 430/5 |
| 6,749,972 B2 * | 6/2004 | Yu | | 430/5 |
| 6,978,438 B1 * | 12/2005 | Capodieci | | 716/21 |
| 7,067,221 B2 * | 6/2006 | Mesuda et al. | | 430/5 |
| 7,264,905 B2 * | 9/2007 | Nagamura et al. | | 430/5 |
| 7,266,801 B2 * | 9/2007 | Kotani et al. | | 716/21 |
| 7,287,240 B2 * | 10/2007 | Toyama et al. | | 716/21 |
| 2002/0188925 A1 * | 12/2002 | Higashi | | 716/21 |
| 2004/0081898 A1 * | 4/2004 | Kamm et al. | | 430/5 |
| 2004/0151992 A1 * | 8/2004 | Nagamura et al. | | 430/5 |

(Continued)

FOREIGN PATENT DOCUMENTS

CN 14995741 A 5/2004

(Continued)

OTHER PUBLICATIONS

David M. Newmark et al., Photomask Technology and Management, "Large Area Optical Proximity Correction using Pattern Based Corrections", SPIE vol. 2322, pp. 374-386, (1994).

(Continued)

*Primary Examiner*—Jack Chiang
*Assistant Examiner*—Binh C Tat
(74) *Attorney, Agent, or Firm*—Finnegan, Henderson, Farabow, Garrett & Dunner, L.L.P.

(57) ABSTRACT

A pattern data correction method is disclosed, which comprises preparing an integrated circuit pattern, setting a tolerance to the pattern that is allowable error range when the pattern is transferred on a substrate, creating a target pattern within the tolerance, and making correction for the target pattern to make a first correction pattern under a predetermined condition.

7 Claims, 5 Drawing Sheets

U.S. PATENT DOCUMENTS

2005/0229148 A1* 10/2005 Melvin, III .................. 716/21
2005/0235245 A1* 10/2005 Kotani et al. .................. 716/19

FOREIGN PATENT DOCUMENTS

| JP | 9-319067 | 12/1997 |
|---|---|---|
| JP | 2001-13668 A | 1/2001 |
| JP | 2002-131882 | 5/2002 |

OTHER PUBLICATIONS

Notification of Reasons for Rejection from Japanese Patent Office mailed Dec. 22, 2006, in Japanese Application No. 094117277, and English translation thereof.

Toshiya Kotani et al., "Mask Pattern Correcting Method, Mask Pattern Inspecting Method, Photo Mask Manufacturing Method, and Semiconductor Device Manufacturing Method", U.S. Appl. No. 11/068,896, filed Mar. 2, 2005.

Notification of Reasons for Rejection from the Japanese Patent Office, mailed Jul. 29, 2008, in Japanese Patent Application No. 2004-160127, and English translation thereof.

Official Action issued from Chinese Patent Office on Nov. 6, 2009 in corresponding Application No. 200510073472.0.

* cited by examiner

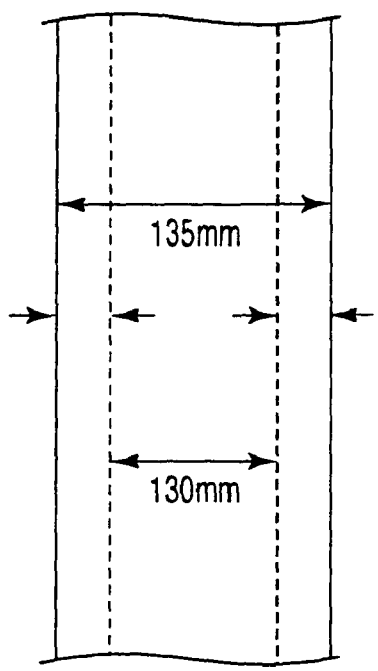
F I G. 4
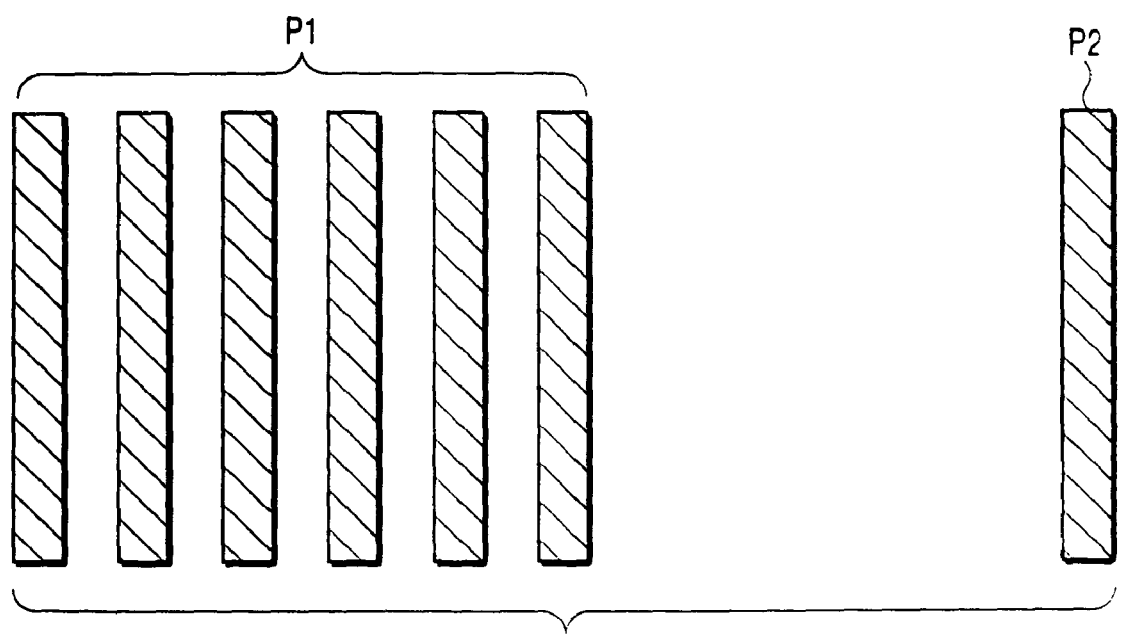
F I G. 5

PATTERN DATA CORRECTION METHOD, PATTERN CHECKING METHOD, PATTERN CHECK PROGRAM, PHOTO MASK PRODUCING METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2004-160127, filed May 28, 2004, the entire contents of which are incorporated herein by reference.

BACKGROUND OF THE INVENTION

1. Field of the Invention

The present invention relates to a pattern data correction method, a pattern checking method, a pattern check program, a photo mask producing method, and a semiconductor device manufacturing method in a semiconductor integrated circuit.

2. Description of the Related Art

In recent years, progress in a semiconductor manufacturing technique has been very remarkable, and a semiconductor whose size is 70 nm of the minimum design rule has been mass-produced. Such downsizing is achieved by remarkable progress in downsizing pattern forming techniques such as a mask process technique, an optical lithography technique, and an etching technique. In the generation when a pattern size is sufficiently large, a planar shape of an integrated circuit pattern to be formed on a wafer is written as a design pattern without being processed, a mask pattern faithful to the design pattern is produced, the mask pattern is transferred onto a wafer by means of a projection optical system, and an under-resist layer is etched, whereby a pattern as desired is successfully formed on the wafer. However, as downsizing of an integrated circuit pattern advances, it becomes difficult to faithfully form a pattern in each process, and there occurs a problem that the finally finished dimension of the pattern is deviated from that of the design pattern.

In particular, in a lithography process and an etching process that are the most important to achieve a fine processing, other pattern layouts arranged at the periphery of the pattern to be formed have great effect on dimensional precision of the pattern.

So-called optical proximity correction (OPC) and process proximity correction (PPC) techniques have been developed in order to avoid the above disadvantage. In these correction techniques, an auxiliary pattern is added to the design pattern in advance or the width of the design pattern is increased or decreased in advance so that dimension of a pattern after processed becomes the dimension of the design pattern (a desired value). These techniques have been reported by, for example, Jpn. Pat. Appln. KOKAI Publication No. 09-319067 and SPIE Vol. 2322 (1994) 374 (Large Area Optical Proximity Correction Using Pattern Based Correction, D. M. Newmark, et. al).

It becomes possible to form an integrated circuit pattern written by a designer on a wafer by using the technique. In a currently widely used CPC/PPC techniques, however, it is premised that a process condition is an optimal condition and that a pattern formed on a wafer after corrected is a pattern as written by the designer. In other words, in this technique, a pattern is formed on a wafer as written by the designer, under an optimal condition. Variations in the processes are out of consideration.

Since, in the above technique, so-called process variations (such as focus variation of an exposure device or exposure dose variation) are not considered, there may occur a case in which an integrated circuit pattern formed on a wafer largely changes from a desired shape when such process variations occur. In addition, all of the portions of the integrated circuit pattern, for example, a transistor portion, a wiring portion, and a bend portion of a wiring, are corrected in accordance with the same standard. Therefore, a portion at which the tolerance is large in terms of circuit performance or manufacture is strictly corrected in the same manner as a portion to be strictly managed. This causes an increase in processing time or a complicated mask shape.

BRIEF SUMMARY OF THE INVENTION

According to a first aspect of the present invention, there is provided a pattern data correction method comprising:

preparing an integrated circuit pattern;

setting a tolerance to the pattern that is allowable error range when the pattern is transferred on a substrate;

creating a target pattern within the tolerance; and making correction for the target pattern to make a first correction pattern under a predetermined condition.

According to a second aspect of the present invention, there is provided a pattern data correction method, comprising:

preparing an integrated circuit pattern including a design pattern;

setting a tolerance to a first pattern to be formed on a substrate when the design pattern is transferred on the substrate or a second pattern to be formed by processing the substrate by using the first pattern as a mask;

making correction for the integrated circuit pattern to make a first correction pattern, under a predetermined condition taking into consideration one or more effects including an effect caused when transferring the design pattern, an affect caused when forming the first pattern, and an effect caused when forming the second pattern;

creating a target pattern to ensure a predetermined process margin on the substrate in the tolerance based on the first correction pattern; and making correction for the target pattern to make a second correction pattern, under a predetermined condition taking into consideration an effect caused when transferring the design pattern, an effect caused when forming the first pattern, and an effect caused when forming the second pattern.

According to a third aspect of the present invention, there is provided a pattern checking method comprising:

obtaining a third pattern to be transferred onto a substrate, when a pattern is transferred onto the substrate with a pattern data produced by using the pattern data correction method, as recited in the first or second aspect of the present invention; and checking whether or not an edge position of the third pattern is within the tolerance of the first pattern.

According to a fourth aspect of the present invention, there is provided a pattern checking method comprising:

obtaining a third pattern to be produced by processing a substrate, when a pattern is transferred onto the substrate with a pattern data produced by using the pattern data correction method, as recited in the first or second aspect of the present invention; and checking whether or not an edge position of the third pattern is within the tolerance of the second pattern.

According to a fifth aspect of the present invention, there is provided a pattern checking program executable by a computer, comprising:

obtaining a third pattern to be transferred onto a substrate, when a pattern is transferred onto the substrate with a pattern data produced by using the pattern data correction method, as recited in the first or second aspect of the present invention; and checking whether or not an edge position of the third pattern is within the tolerance of the first pattern.

According to a sixth aspect of the present invention, there is provided a pattern checking program executable by a computer, comprising:

obtaining a third pattern to be produced by processing a substrate, when a pattern is transferred onto the substrate with a pattern data produced by using the pattern data correction method, as recited in the first or second aspect of the present invention; and checking whether or not an edge position of the third pattern is within the tolerance of the second pattern.

According to a seventh aspect of the present invention, there is provided a photo mask producing method for producing a photo mask with a pattern data produced by using the pattern data correction method, as recited in the first or second aspect of the present invention.

According to an eighth aspect of the present invention, there is provided a semiconductor device manufacturing method for manufacturing a semiconductor device with a photo mask produced by using the photo mask producing method, as recited in the seventh aspect of the present invention.

According to a ninth aspect of the present invention, there is provided a pattern date correction method comprising:

preparing an integrated circuit pattern;

setting a tolerance to the pattern that is allowable error range when the pattern is transferred on a substrate;

making a first correction to the pattern under a predetermined condition;

obtaining a target pattern using simulation under the condition;

setting a tolerance to the target pattern; and creating a second target pattern within the tolerance.

BRIEF DESCRIPTION OF THE SEVERAL VIEWS OF THE DRAWING

FIG. 4 is a plan view showing a pattern;

FIG. 5 is a plan view showing an integrated circuit pattern that includes a 130 nm L/S pattern and an isolated 130 nm line pattern;

DETAILED DESCRIPTION OF THE INVENTION

Hereinafter, embodiments of the present invention will be described with reference to the accompanying drawings.

First Embodiment

A description will be given with respect to a method for producing data of a pattern used in an exposure mask, from a design data for an integrated circuit. Further, a description will be given, with respect to a method for checking a produced pattern.

Figure 1:
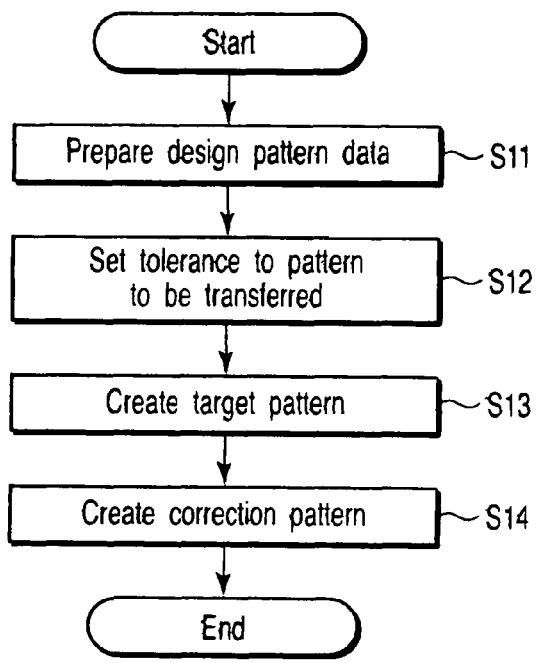
FIG. 1 is a flow chart showing a mask data correction method according to a first embodiment of the present invention.

FIG. 1 is a flow chart showing a mask data producing method according to a first embodiment of the present invention.

Figure 2:
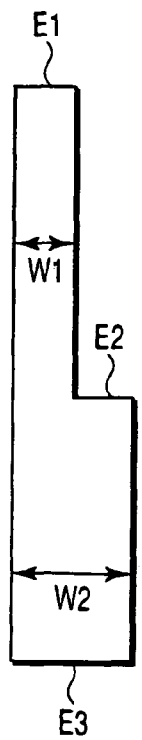
FIG. 2 is a plan view showing a pattern included in a design pattern data.

First, a design pattern data of an integrated circuit is prepared (step ST11). In the embodiment, a design pattern data including a pattern shown in FIG. 2 is prepared. The following description will be given, with respect to a method for producing mask pattern data by carrying out processes for the pattern shown in FIG. 2.

Next, a tolerance on a wafer is set to the pattern (step ST12). For example, techniques for setting a tolerance include the techniques described items (1) to (6) below. Here, a tolerance is set to a first pattern transferred to a resist or a second pattern obtained by processing a substrate by using the first pattern for a mask. However, in this embodiment, a tolerance is set to the first pattern transferred to a resist.

(1) A rate (for example, ±10%) is set as a tolerance, according to a pattern line width and a distance between the adjacent patterns.

(2) A specific value (for example, a value specified by 10% of the minimum line width, e.g., ±13 nm in the case where 130 nm is the minimum line width) is set as a tolerance, regardless of a pattern line width and a distance between the adjacent patterns.

(3) A tolerance is set, according to a pattern line width and a distance between the adjacent patterns. For example, in the case where a wiring width is defined as W, the tolerance is such as shown in Table 1.

TABLE 1

| Line width W | Tolerance |
| --- | --- |
| 100 nm < W ≦ 130 nm | ±10 nm |
| 130 nm < W ≦ 180 nm | ±15 mn |
| 180 nm < W | ±20 nm |

(4) A tolerance is changed, according to the shape of an integrated circuit pattern. Tolerances are set for a line edge, a corner, and the like, respectively.

(5) A tolerance is changed, according to, for example, whether or not a contact hole pattern is arranged in an upper layer and/or a lower layer based on a relationship with another layer. In the case of a gate electrode layer of a transistor, the tolerance is changed, according to a portion which actually functions as a gate electrode and a portion which functions as a wiring.

(6) A tolerance is set, for each process. For example, for a line width of 130 nm, ±10 nm is allocated in an exposure process, ±9 nm is allocated in a mechanical process, and as a whole, ±13 nm is allocated.

Table 2 shows a tolerance set to the pattern shown in FIG. 2. In FIG. 2, a width W1 of a design pattern is 130 nm and a width W2 of the design pattern is 180 nm.

TABLE 2

|    | Tolerance        |
|----|------------------|
| E1 | +20 nm, −13 nm   |
| E2 | none             |
| E3 | +20 nm, −18 nm   |
| W1 | ±13 nm           |
| W2 | ±18 nm           |

The tolerance shown in Table 2 is determined by combining the methods in techniques (1) and (4). Here, edges E1 and E3 denote line edges. A range from +20 nm to −13 nm is set to edge E1 as the tolerance, and a range from +20 nm to −18 nm is set to edge E3 as the tolerance. A range of 10% of a line width of a target pattern is set to line widths W1 and W2, Edge E2 is a small step, and thus, a tolerance is not set to Edge E2. In addition, edge E3 is not assumed to be moved in the following correction step.

Next, a target shape to be formed on a wafer is set (step ST13). In a conventional technique, only a tolerance is set in step ST11, and a target shape is not set.

There may be following measures to set the target shape.

(a) The target shape is set at the midpoint between an upper limit and a lower limit of the tolerance set in step ST12.

(b) A lithography simulation is utilized.

(c) A process simulation is utilized.

(d) The target shape is set in consideration of the past wafer yield.

With respect to technique (a), in the case where the upper limit and the lower limit of the tolerance are uniform (in the case where the limits are ±10%), the target coincides with the design pattern data. In the case where the positive limit and the negative limit are not uniform with each other, as in the line edges denoted by E1 and E3, a portion different from the design pattern data is made to be a target for correction.

With respect to technique (b), for example, there is considered that a pattern of a line width W1 shown in FIG. 2 is formed on a wafer in accordance with the following condition. That is, an exposure device having a wavelength 248 nm of a projection optical system, a numeral aperture (NA) of 0.60, a coherence factor (σ) of 0.75, and a ring band shield rate of ⅔, is used. Further, a half tone type phase shift mask (transmission rate of a shield portion being 6%, and phase difference being 180 degrees) is used. Pattern dimensions formed when an exposure dose and a focus position are changed are obtained by means of computation. Next, in the case where an exposure dose margin of lithography of 10% is ensured, a dimension in which the maximum focus margin can be obtained is obtained by means of computation.

Figure 3:
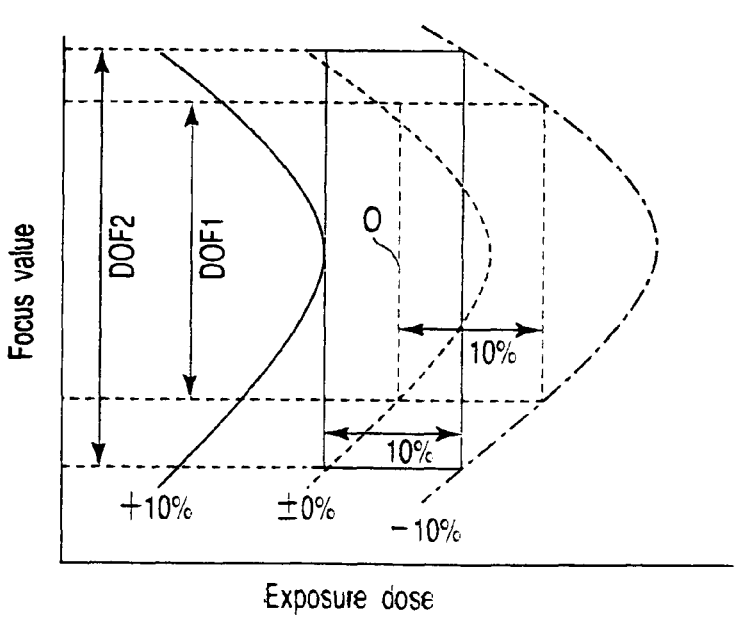
FIG. 3 is a graph showing an exposure dose and a focus position when a pattern of a given line width is to be formed.

FIG. 3 is a graph showing an exposure dose and a focus position when a pattern of a given line width is to be formed. The exposure dose and focus position are shown in a mode called so-called ED-tree analysis. In the case where the tolerance of a width W2 is ±10%, the solid line denotes −10%; the broken line denotes target dimensions, and the one-dot chain line denotes +10%.

In the case where the design pattern is defined as a target pattern and the tolerance of 10% is ensured, a focus margin of 0.26 µm (DOF 1) can be ensured in an area indicated by the broken line in FIG. 3. In a square enclosed by the solid line in FIG. 3, a focus margin of 0.37 µm is ensured. Thus, by defining the target pattern on a wafer to have a line width whose midpoint O is in a just focus, the maximum exposure dose margin on the wafer can be established in the tolerance. In the case of the present embodiment, the exposure dose margin was 0.135 µm. In this case, when correction is carried out in the next step, the line width of the target pattern on the wafer is 0.135 µm, and each edge of the target pattern as expanded by 2.5 nm (FIG. 4).

Technique (d) utilizes the past experiences. For example, there is a case in which the yield is improved for the tolerance of a pattern on a wafer (step ST12), by targeting an edge position which is different from an edge position denoted in a design circuit pattern in each process. In this case, the different edge position is set.

Correction is carried out for achieving the target shape set in step ST13, and a correction pattern is formed (step ST14). Since, in the correction in this case, model based correction, rule based correction and the like exist, one of these corrections can be properly selected, in accordance with the pattern arrangement. For example, with respect to edge E1 and edge E3 in the pattern shown in FIG. 2, the tolerances are large, and thus, an edge terminal is extended by using the rule base correction. With respect to the line width W1, its tolerance is small, and thus, the model based correction is applied by using a high precision simulator (for example, vector model). With respect to the line width W2, its tolerance is large, and thus, the model based correction is applied by using a high operation speed simulator (for example, color model). That is, this pattern data correction method is a method in which correction is made according to a length of a side of a target pattern. Here, the vector model and scalar model denote an optical computation method used in lithography simulation. While the present embodiment uses different models, it is possible to make correction by using the same model.

The above processing operations are carried out for each pattern included in design pattern data, whereby mask pattern data is formed.

Second Embodiment

Now, a description will be given with respect to a method for checking whether a target pattern is formed or not by using a mask formed from the formed mask pattern data.

The present embodiment describes the step of making correction by using model based OPC in the case where an integrated circuit pattern formed by a 130 nm line/130 nm space (130 nm L/S) pattern P1 and an isolated 130 nm line P2 shown in FIG. 5 is formed on a wafer, by using an exposure device having a wavelength 248 nm of a projection optical system, a numeral aperture (NA) of 0.60, a coherence factor (σ) of 0.75 and a ring band shield rate of ⅔, and a half tone type phase shift mask (transmission rate of a shield portion being 6% and phase difference being 180 degrees).

Figure 6:
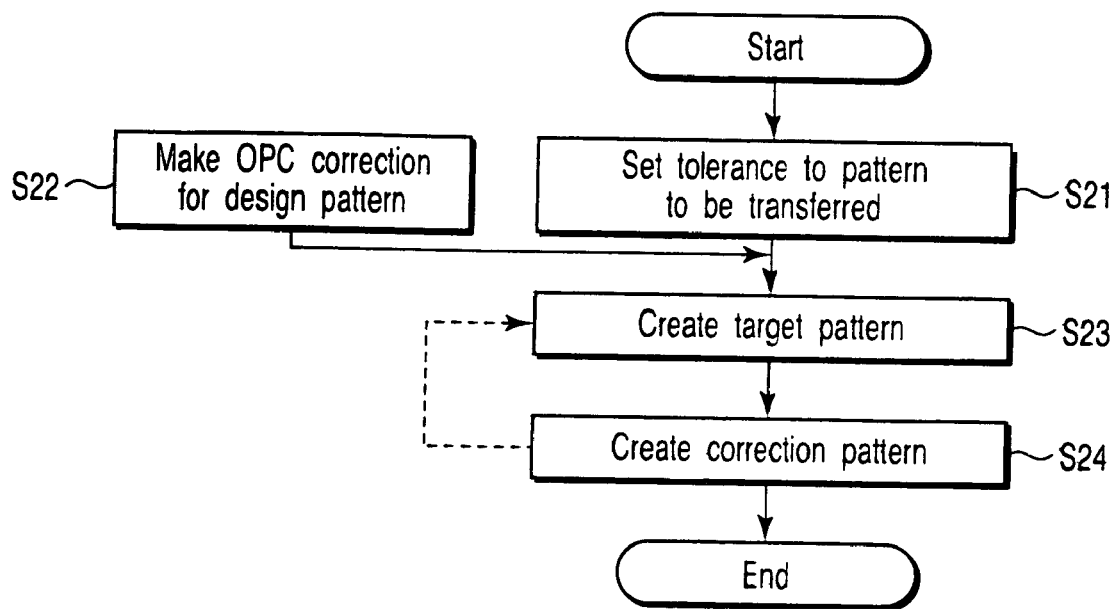
FIG. 6 is a flow chart showing procedures in an exposure data producing method according to a second embodiment of the present invention.

FIG. 6 is a flow chart showing procedures in a mask data correction method according to a second embodiment of the present invention.

First, a tolerance is set for each pattern included in a design pattern data (step ST21). For example, ±13 nm is set for an L/S pattern and an isolation pattern.

Figure 7:
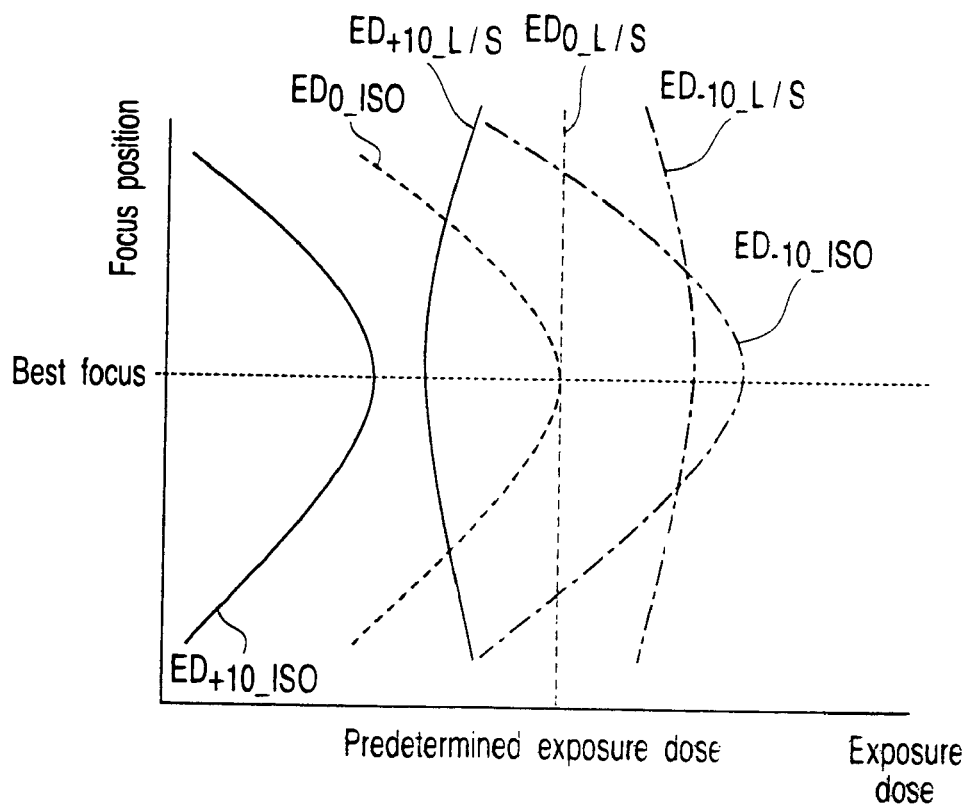
FIG. 7 is a graph showing a result obtained by carrying out ED-tree analysis for a first OPC pattern.

Model based OPC is carried out for a design pattern to produce a first OPC pattern (step ST22). FIG. 7 shows a result obtained by carrying out ED-tree analysis for the first OPC pattern. In FIG. 7, $ED_{+10\_LS}$ denotes an ED-tree in which an L/S pattern having a width of the tolerance of +10% is formed, $ED_{0\_LS}$ denotes an ED-tree on which an L/S pattern having a width of the tolerance of ±0% is formed, $ED_{-10\_LS}$ denotes an ED tree on which an L/S pattern having a width of the tolerance of −10% is formed, $ED_{+10\_ISO}$ denotes an ED-tree on which an isolated pattern having a width of the tolerance of ±10% is formed, $ED_{0\_ISO}$ denotes an ED-tree on which an isolated pattern having a width of the tolerance of ±0% is formed, and $ED_{-10\_IDO}$ denotes an ED-tree on which an isolated pattern having a width of the tolerance of −10% is formed. With an optimal exposure dose and an optimal focus value, $ED_{0\_L/S}$ and $ED_{0\_ISO}$ coincide with each other, and an L/S pattern and an isolated pattern as designed are formed.

Figure 8A:
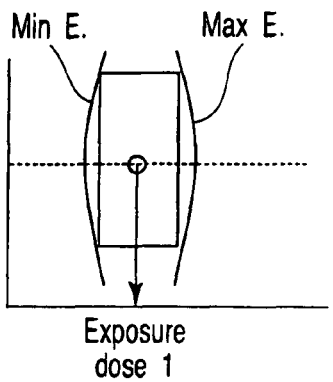
FIG. 8A is a graph showing an ED-tree of a 130 nm L/S pattern.
Figure 8B:
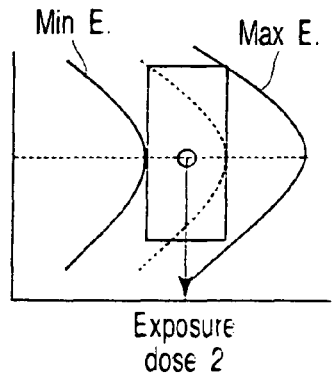
FIG. 8B is a graph showing an ED-tree of a 130 nm isolation pattern.

There are two techniques of obtaining a point at which the maximum exposure dose margin can be ensured for the L/S pattern an isolated pattern. In the first technique, a point at which the maximum focus margin can be ensured is obtained in the case where a predetermined exposure dose margin (for example, 10%) has been ensured, as described in the first embodiment. In the second technique, a point at which the maximum exposure dose margin can be ensured is obtained in the case where a predetermined focus margin has been ensured. Values of Max E and Min E shown in FIG. 8A and values of Max E and Min E shown in FIG. 8B are obtained, and the point is set at the midpoint of the values. FIG. 8A shows an ED-tree of a 130 nm L/S pattern, and FIG. 8B shows an ED-tree of an isolated pattern.

With reference to the second technique, a description will be given with respect to how to obtain a point at which the maximum exposure dose margin can be ensured for an L/S pattern and an isolated pattern. First, exposure doses $E_{max\_df0}$ (corresponding to a dimensional change of −10%) and $E_{min\_df0}$ (corresponding to a dimensional change of +10%) are obtained. The doses $E_{max\_df0}$ and $E_{min\_df0}$ provide tolerance of ±10% in the case where a defocus value is 0 µm. Next, for example, exposure doses $E_{max\_df200}$ and $E_{min\_df200}$, which provide tolerance of ±10% in the case where the defocus value is 0.2 µm, are obtained. Assuming that a smaller one of $E_{max\_df0}$ and $E_{max\_df200}$ is defined as $E_{max}$ and a larger one of $E_{min\_df0}$ and $E_{min\_df200}$ is defined as $E_{min}$, a point at which the maximum exposure dose margin is ensured can be obtained by $(E_{max}+E_{min})/2$.

Figure 9:
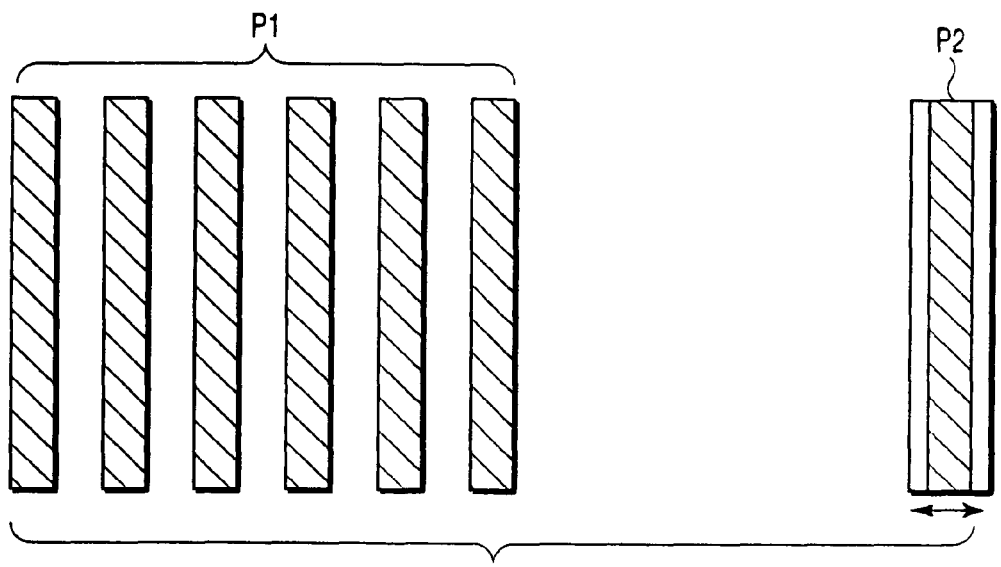
FIG. 9 is a plan view showing a target pattern according to the second embodiment of the present invention.

After the point at which the maximum exposure dose margin can be ensured has been obtained by $(E_{max}+E_{min})/2$, dimensions of the patterns at this point are obtained. The dimensions can be obtained by using lithography simulation, since an illumination condition, an exposure dose, and a pattern shape are known. As a result, with regard to the 130 nm L/S pattern, the dimension was 130 nm, which is equal to its original dimension. On the other hand, with regard to the isolated 130 nm line, the dimension was 135 nm. Then, a line width of the isolated pattern is modified to 135 nm, and a target pattern is produced as shown in FIG. 9 (step ST23).

Figure 10:
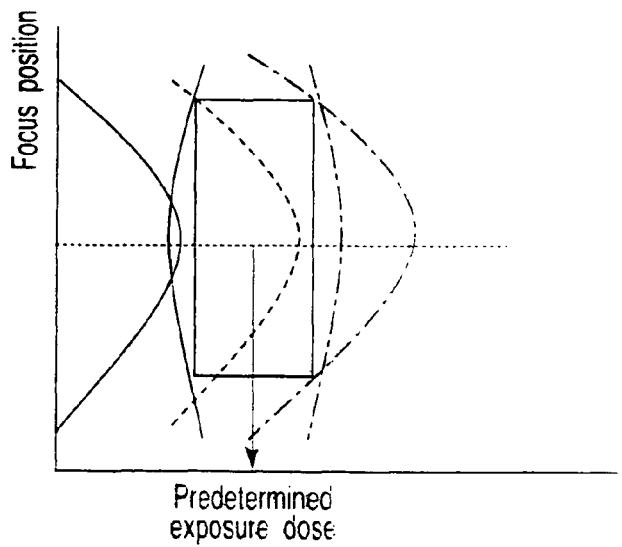
FIG. 10 is a view showing a result obtained by carrying out an ED-tree analysis for a target pattern.

For the target pattern set at step ST23, correction is carried out In accordance with model based OPC using a simulator model having a predetermine exposure dose and focus value (optimal exposure dose and optimal focus value) (step ST24). As a result of making correction, as shown in FIG. 10, an exposure dose margin larger than the exposure dose margin shown in FIG. 7 can be ensured. Specifically, in the case where the exposure dose margin of 10% was ensured, the focus margin in the case of FIG. 7 was 0.282 µm, whereas the focus margin in the case of FIG. 10 was 0.356 µm.

In order to more strictly obtain the point at which the exposure dose margin becomes maximal, it is preferable that a new target pattern is produced based on the correction pattern and the tolerance, and correction be carried out for the new target pattern a plurality of times.

Third Embodiment

Figure 11:
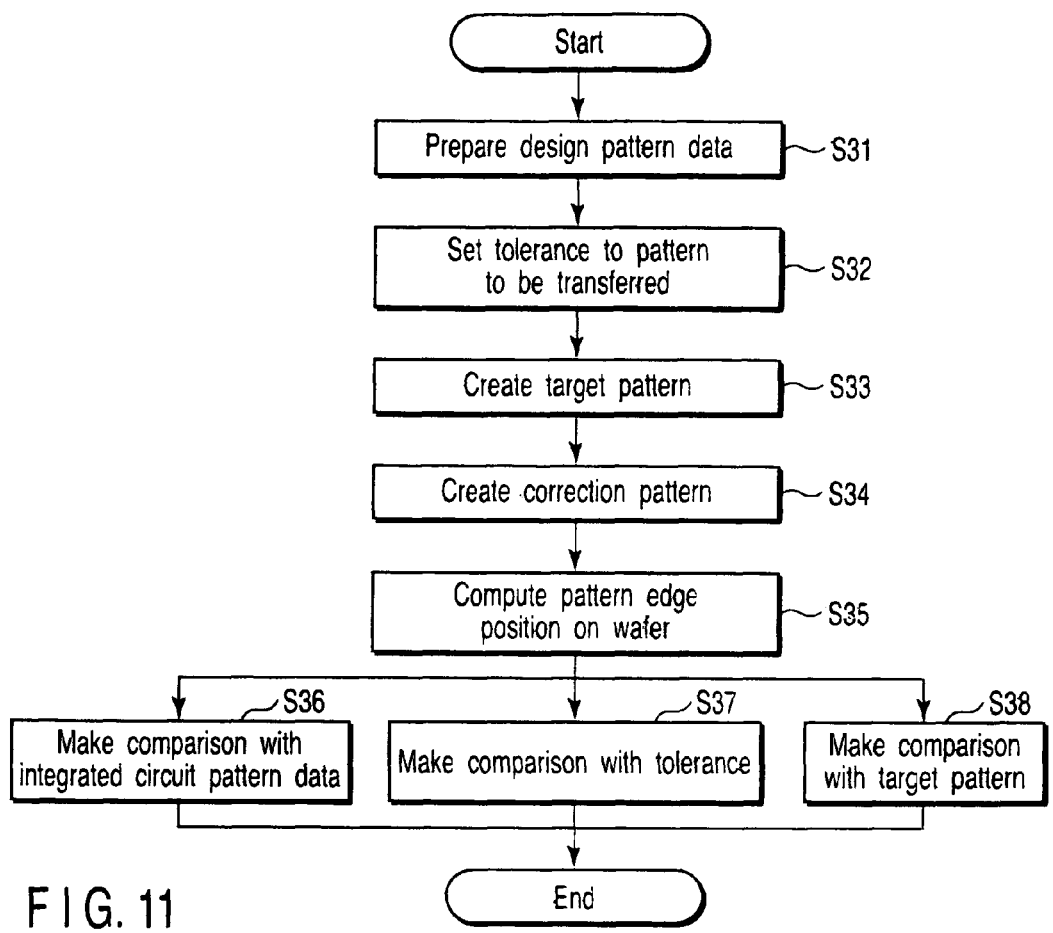
FIG. 11 is a flow chart showing procedures in an exposure data producing method according to a third embodiment of the present invention.

FIG. 11 is a flow chart showing procedures in an exposure data producing method according to a third embodiment of the present invention.

First, a design pattern data of an integrated circuit is prepared (step ST31). Next, a tolerance on a wafer is set to the pattern (step ST32). Thereafter, a target pattern is produced (step ST33). A correction pattern is produced (step ST34). The correction pattern is produced based on the tolerance set at step ST32 in accordance with the method described in the first and second embodiments.

Figure 12:
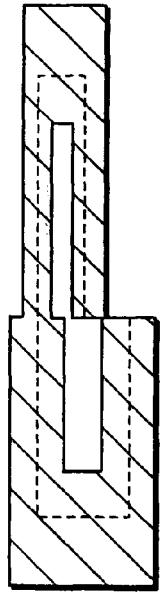
FIG. 12 is a view showing a layer of a tolerance according to the third embodiment.

The tolerance may be set in accordance with a method for providing a margin to each pattern edge as described in the first embodiment. In addition, a technique of producing a layer of the tolerance on data may be used, as shown in FIG. 12.

Figure 13:
FIG. 13 is a view showing a pattern obtained by simulation.

An edge position of a pattern formed on a wafer is obtained by simulation (step ST35). FIG. 13 shows a pattern obtained by carrying out simulation for the pattern shown in FIG. 2. Although the pattern edge is denoted in a shape configured by connecting the edges by lines, is is possible to obtain the edge by computation in the correction.

A comparison between the obtained pattern edge position and design pattern data is carried out (step ST36). In addition, a comparison between the obtained pattern edge position and the tolerance on the wafer is carried out in order to determine whether or not the obtained pattern edge position is within the tolerance (step ST37). Further, a comparison between the obtained pattern edge position and a target pattern is carried out (step ST38).

Figure 14:
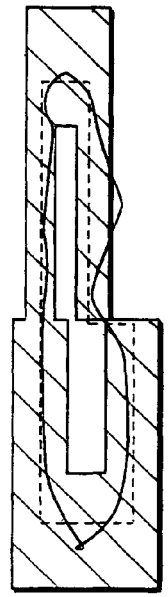
FIG. 14 is a view showing an example in which the layer of a tolerance and the pattern obtained by the simulation are superimposed on each other.

Step ST36 is a known checking technique, and steps ST37 and ST38 are checking steps according to the present embodiment. For example, in the step ST37, a portion at which an edge position is outside the tolerance (hatched area) is defined to be NG, and the other portions are defined to be OK, as shown in FIG. 14.

The checking method described in the above embodiments can be used as a program which can be executed by a computer and can be distributed by storing in a storage medium such as a magnetic disk (such as a floppy disk (registered trademark) or a hard disk), an optical disk (such as a CD-ROM or a DVD), a magneto-optical disk (MO), or a semi-conductor memory.

Further, the storage medium may have any storage format as long as the storage medium is the one which is capable of storing a program and which is computer-readable.

In addition, an operating system (OS) running on a computer based on an instruction of a program installed from a storage medium into a computer or middleware (MW) such as database management software or network software may execute part of the processing operations to realize the above-mentioned embodiments.

Moreover, the storage mediums is not limited to a medium independent of a computer, but include a storage medium in which a program transmitted via LAN (Local Area Network), the Internet or the like is downloaded and is stored. In addition, one or a plurality of storage mediums may be included.

There may be used any computer constituted by a single device including a personal computer or a system in which a plurality of devices are connected via a network, as long as it executes the processes in the embodiments based on a program stored in a storage medium.

The computer used here is not limited to a personal computer, but includes an arithmetic processing unit, a microcomputer and the like included in information processing embodiment. In other words, the computer used here includes any equipment and device capable of achieving the functions of the embodiments of the invention by using a program.

Further, a photo mask can be manufactured by using a pattern data produced by using the pattern data correction method as described in the above embodiments. Moreover, a semiconductor device can be manufactured by using the photo mask in an exposure process of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern data correction method comprising:
   preparing by computer design pattern data including integrated circuit pattern data;
   setting a tolerance to a transferred pattern of the design pattern that is within an allowable error range when the design pattern is transferred on a wafer;
   setting a target pattern within the tolerance to the transferred pattern, wherein setting the target pattern includes:
   setting a margin of an exposure dose;
   obtaining a midpoint of the exposure dose at which a predetermined focus margin is ensured within the exposure dose margin; and
   obtaining an edge position of a pattern on the substrate in an exposure dose at the midpoint; and
   making a correction for the target pattern corresponding to the design pattern to make a first correction pattern under a predetermined condition.

2. A pattern data correction method according to claim 1, wherein setting the target pattern includes:
   obtaining an exposure dose which corresponds to a lower limit and an exposure dose which corresponds to an upper limit in the tolerance in each of two focus values;
   obtaining a smaller exposure dose value of the exposure doses which correspond to the lower limits in the two focus values;
   obtaining a larger exposure dose value of the exposure doses which correspond to the upper limits in the two focus values;
   setting an exposure dose included within a range of the two obtained exposure doses; and
   obtaining an edge position of a pattern on the substrate which is formed in the set exposure dose.

3. A pattern data correction method according to claim 1, wherein setting the target pattern includes:
   obtaining an exposure dose which corresponds to a lower limit and an exposure dose which corresponds to an upper limit in the tolerance in each of two focus values;
   obtaining a larger exposure dose value of the exposure doses which correspond to the lower limits in the two focus values;
   obtaining a smaller exposure dose value of the exposure doses which correspond to the upper limits in the two focus values;
   setting an exposure dose included within a range of the two obtained exposure doses; and
   obtaining an edge position of a pattern on the substrate which is formed in the set exposure dose.

4. A pattern data correction method according to claim 1, wherein making the first correction pattern includes selecting a correction according to a length of a side of the target pattern.

5. A pattern data correction method according to claim 1, wherein the predetermined condition is a condition which is used when forming a pattern on the substrate.

6. A photo mask producing method for creating a photo mask with a pattern data produced by using the pattern data correction method according to claim 1.

7. A semiconductor device manufacturing method for manufacturing a semiconductor device with a photo mask produced by using the photo mask creating method according to claim 6.

* * * * *